United States Patent [19]
Blodgett

[11] Patent Number: 5,898,639
[45] Date of Patent: Apr. 27, 1999

[54] MEMORY WITH VARIABLE WRITE DRIVER OPERATION

[75] Inventor: Greg A. Blodgett, Nampa, Id.

[73] Assignee: Micron Technology, Inc., Boise, Id.

[21] Appl. No.: 08/918,635

[22] Filed: Aug. 22, 1997

[51] Int. Cl.$^6$ ................................................ G11C 8/00
[52] U.S. Cl. ........................... 365/230.06; 365/230.08
[58] Field of Search ...................... 365/185.12, 189.05, 365/230.03, 230.06, 230.08

[56] References Cited

U.S. PATENT DOCUMENTS

| | | | |
|---|---|---|---|
| 5,400,289 | 3/1995 | Blodgett ................................. | 355/222 |
| 5,455,801 | 10/1995 | Blodgett et al. ...................... | 365/222 |
| 5,615,149 | 3/1997 | Kobayashi et al. ................... | 365/185.12 |
| 5,657,292 | 8/1997 | McClure ............................... | 365/230.03 |
| 5,703,813 | 12/1997 | Manning et al. ..................... | 365/189.05 |

*Primary Examiner*—David Nelms
*Assistant Examiner*—David Lam
*Attorney, Agent, or Firm*—Schwegman, Lundberg, Woessner & Kluth, P.A.

[57] ABSTRACT

A memory is described which includes circuitry to modify the operation of a write driver circuit in a memory device in response to a command to close an accessed memory location. The memory includes a write driver circuit for actively driving a data signal during a portion of a write operation. The write driver operation is selectively modified to simultaneously operate with a sense amplifier to complete a write operation prior to closing an accessed row of the array.

16 Claims, 5 Drawing Sheets

MEMORY WITH VARIABLE WRITE DRIVER OPERATION

TECHNICAL FIELD OF THE INVENTION

The present invention relates generally to memory devices and in particular the present invention relates to memory device write divers.

BACKGROUND OF THE INVENTION

Integrated memory devices typically include an array of memory storage locations, or cells, which are arranged in rows and columns. The memory cells are accessed for data storage or retrieval by providing an array address. The address is usually provided in two parts; a row address, and a column address. The memory device decodes the memory array addresses and accesses the appropriate memory cells.

A wide variety of access modes are known to those skilled in the art, including page mode. In a page mode operation a row of the memory array is accessed and remains accessed while different columns of the array are accessed by changing the column address. When all desired operations have been performed in a given page, the accessed row is closed. Prior to closing the row, however, all memory cell operations must be complete.

One memory cell operation which is particularly sensitive to the closing of an accessed row is the memory cell write operation. During a write operation, a memory cell is accessed and a write driver provides a data signal to be stored on the cell. In the worst case, data stored in a memory cell will have to be changed to an opposite data state during a write operation. Typical write operation implementation in a memory device deactivates the write driver early in the write operation, and allows a differential amplifier to drive digit lines to full power supply rails. This can result in a relatively lengthy delay in closing the accessed row. That is, an accessed row cannot be turned off until all memory cells fully store the desired data. The faster the completion of the write operation, therefore, the sooner the row can be closed.

For the reasons stated above, and for other reasons stated below which will become apparent to those skilled in the art upon reading and understanding the present specification, there is a need in the art for a memory device which can close an accessed memory array row in a shorter time period.

SUMMARY OF THE INVENTION

The above mentioned problems with memory devices and other problems are addressed by the present invention and which will be understood by reading and studying the following specification. A memory device is described which adjusts the data write driver operation to increase the speed of a write operation in response to a row closing command.

In particular, the present invention describes a memory device comprising an array of memory cells, a digit line coupled to memory cells of the array, and a sense amplifier coupled to the digit line for sensing a voltage on the digit line. The memory also includes a write driver circuit for actively driving the digit line during a write operation, and a write driver control circuit for simultaneously operating the sense amplifier and the write driver to complete a write operation prior to closing an accessed row of the array.

In another embodiment, a memory is described which comprises a write driver control circuit for activating a write driver circuit, a latch coupled to the write driver circuit for latching the write driver in an active state, and a latch control circuit. The latch control circuit controls the latch such that the latch latches the write driver in an active state for a predetermined time period to insure a minimum write time. The latch continues to latch the write driver in an active state beyond the predetermined time if an accessed row of the memory is commanded to close.

A method of operating a memory device is described in one embodiment. The method comprises the steps of initiating a memory write operation on an accessed memory row, activating a write driver circuit to drive a data signal to a digit line, and activating a sense amplifier coupled to the digit line. The method also includes the steps of monitoring control signals provided to the memory device during the memory write operation to determine if the accessed memory row is to be closed, and extending operation of an active write driver circuit if the accessed memory row is to be closed to increase the execution of the memory write operation.

In yet another embodiment, a method of writing to a row a memory cells in a memory device is described. The method comprises the steps of receiving an active row address strobe signal (RAS*), generating a write driver control signal to activate a write driver circuit during a write operation, and activating a latch circuit to latch the write driver control signal for a first predetermined time. The method further comprises the steps of receiving an inactive RAS* signal, and latching the write driver control signal for a second predetermined time beyond the first predetermined time in response to an inactive RAS* signal transition to maintain the write driver circuit in an active state.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
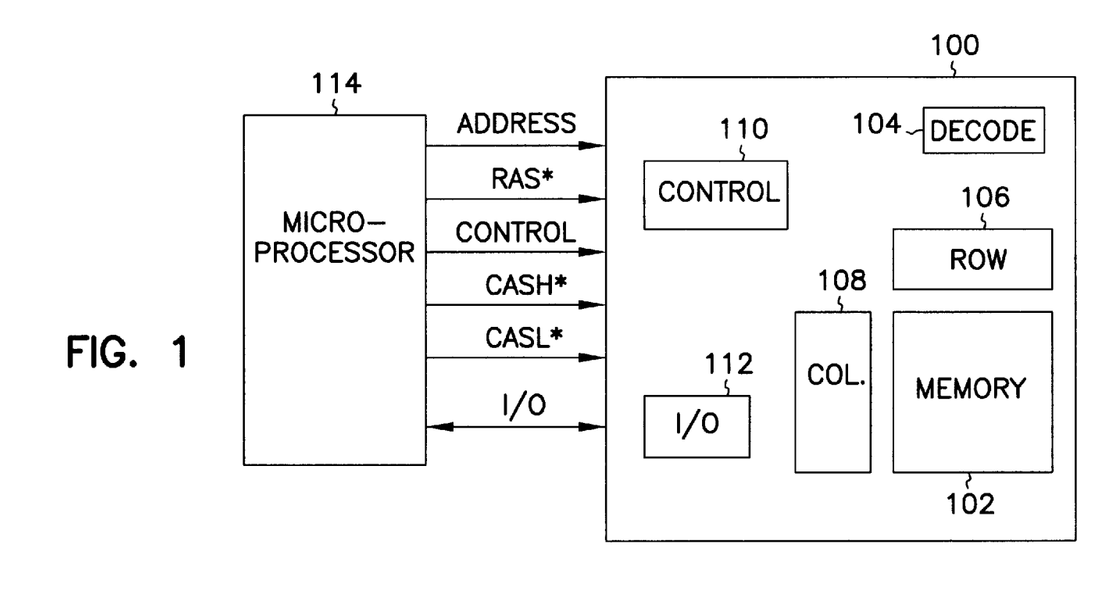
FIG. 1 is a block diagram of a memory device incorporating the present invention.

FIG. 1 is a simplified block diagram of a memory device according to one embodiment of the present invention. The memory device 100 includes an array of memory cells 102, address decoder 104, row access circuitry 106, column access circuitry 108, control circuitry 110, and Input/Output circuit 112. The memory can be coupled to an external microprocessor 114, or memory controller for memory accessing. The memory receives control signals from the processor 114, such as WE*, RAS* and CAS* signals. The memory is used to store data which is accessed via I/O lines. It will be appreciated by those skilled in the art that additional circuitry and control signals can be provided, and that the memory device of FIG. 1 has been simplified to help focus on the present invention.

Figure 2:
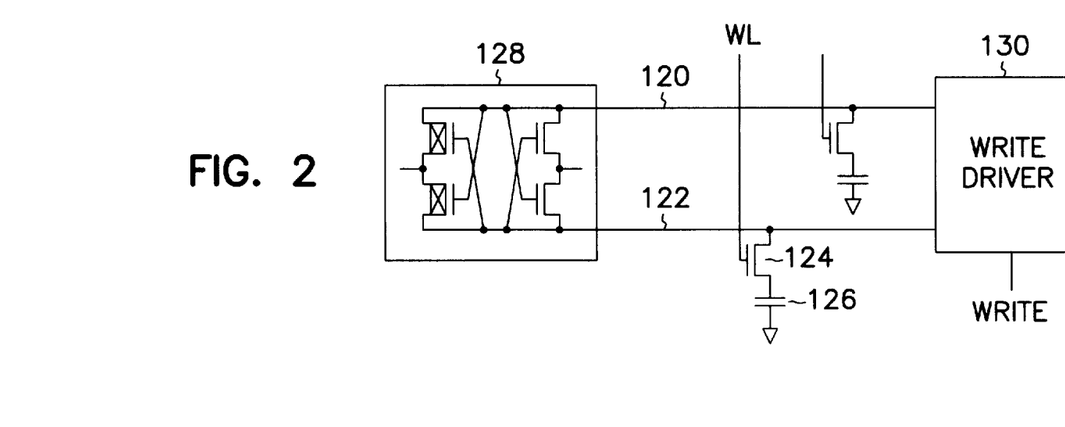
FIG. 2 is a simplified schematic of a portion of the memory device.

Referring to FIG. 2, a portion of the memory device is described. The simplified schematic diagram illustrates a column of a memory array. The column is generally defined by a pair of digit lines 120 and 122. Access transistors 124 are located along the digit lines for coupling memory cells 126 to a digit line. The access transistors are activated by a word line (WL), which defines a row of the memory array. A differential amplifier circuit 128 is provided to detect and amplify signals provided on the digit lines. A write driver circuit 130 is provided for coupling a data signal to the digit lines during a write operation.

Figure 3:
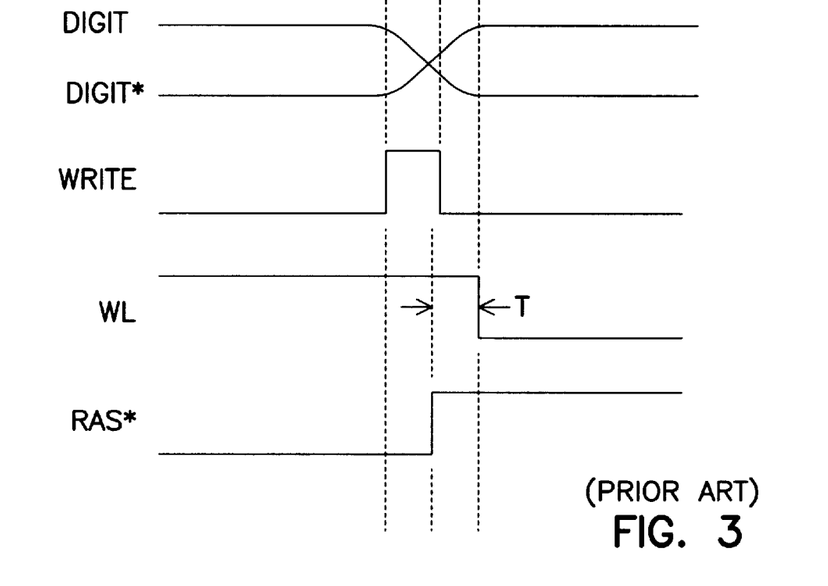
FIG. 3 is a timing diagram of a prior art memory device.

The operation of a prior art memory is illustrated generally in FIG. 3. The Digit and Digit* signals illustrate a voltage on a pair of digit lines. In an initial state, such as following a read operation the Digit line is at a high level. To change the state of the Digit line during a write operation, a write driver circuit is activated with a Write signal to drive the digit line pair toward the desired state. When the digit line voltage levels cross such that the differential amplifier can detect the digit line difference, the write driver circuit is deactivated. As known to those skilled in the art, if the RAS* signal transitions to a high state, the accessed row will be closed. As stated above, the accessed row cannot be closed until the digit lines are at a full power supply rail to insure that the memory cell is fully charged, or discharged. The time between an inactive RAS* signal and when the row can be closed is indicated as time T in FIG. 3. It will be appreciated that a new row of memory cannot be accessed until the current row is closed. To speed future access operations, it would be desired to reduce time T.

Figure 4:
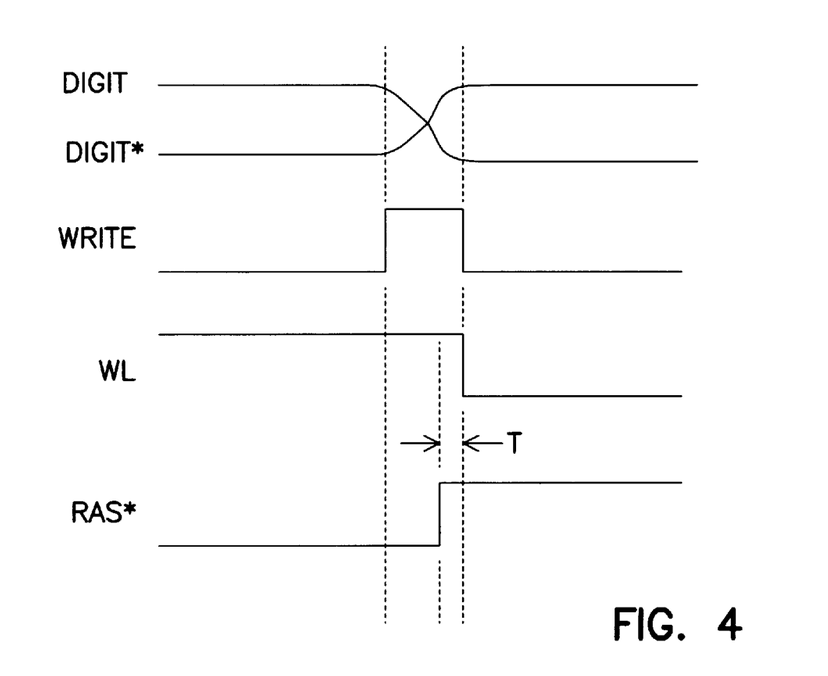
FIG. 4 is timing diagram of the basic operation of the memory of FIG. 1.

The timing diagram of FIG. 4 is a general illustration of the operation of the memory device of FIGS. 1 and 2. Again, in an initial state, the Digit line is at a high level. To change the state of the Digit line during a write operation, the write driver circuit 130 is activated with a write signal to drive the digit line pair toward the desired state. If the RAS* signal transitions to a high state, the write driver circuit is not deactivated when the digit line voltage levels cross. As such, both the differential amplifier 128 and the write driver circuit continue to charge the digit line pair. The time T between an inactive RAS* signal transition and when the row can be closed is reduced from that of FIG. 3.

Figure 5:
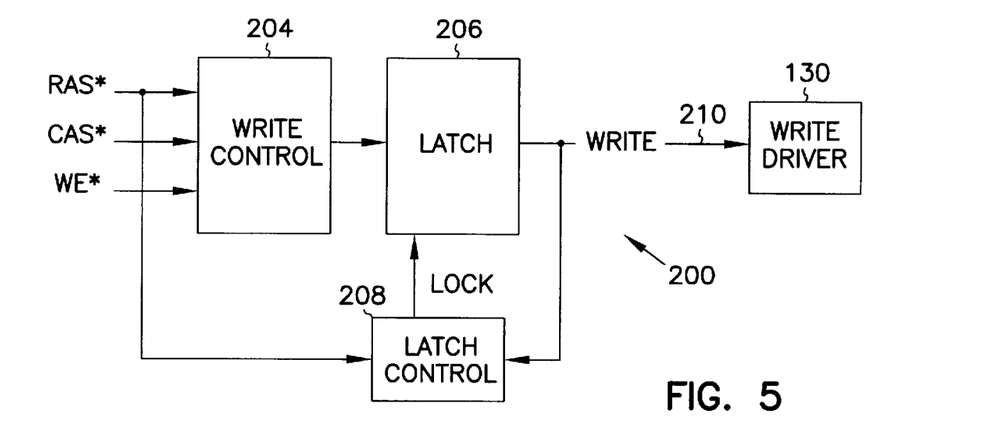
FIG. 5 is a block diagram of a write driver control circuit.

FIG. 5 is a block diagram of a write driver control circuit 200 of the present invention. The circuitry is used to control the operation of write driver 130. A write control circuit 204 is provided to generate a write signal 210 in response to memory inputs, such as CAS*, RAS*, and WE*. A latch 206 is provided to latch the write signal in response to latch control 208. It will be appreciated that the blocks of FIG. 5 can be arranged in different orders to achieve the desired operational features described below.

Figure 6:
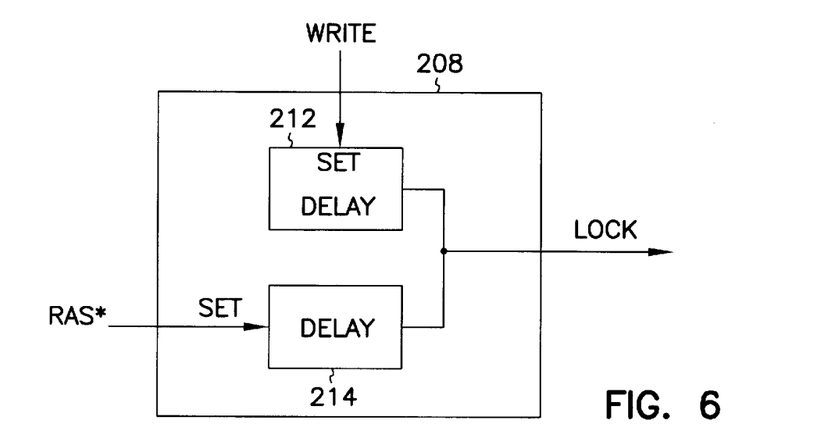
FIG. 6 is a block diagram of one embodiment of a latch control of FIG. 5.

FIG. 6 shows one embodiment of latch control 208. A delay circuit 212 is provided to lock the latch circuit 206 for a first predetermined time to insure that the write driver is active to create a sufficient differential voltage across the digit lines. A second delay circuit 214 is provided to lock the latch circuit for a second predetermined time when the RAS* signal transitions to a high state indicating that an accessed memory row is to be closed.

Figure 7:
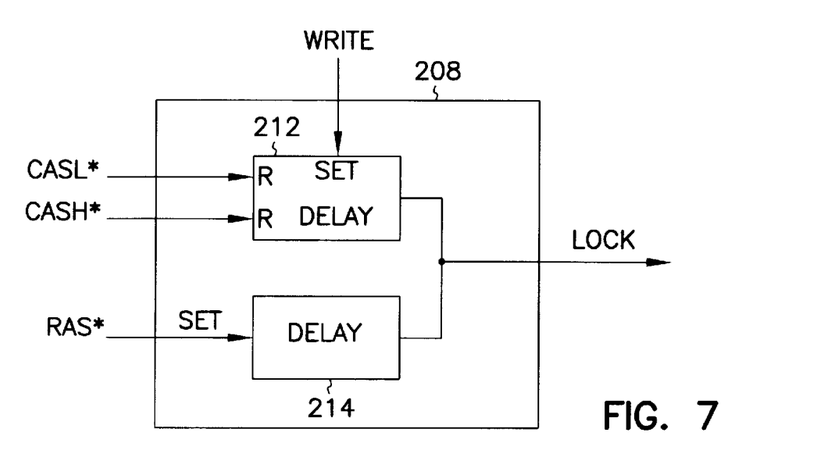
FIG. 7 is a block diagram of another embodiment of a latch control of FIG. 5.

Thus, the write driver 130 is maintained in an active state driving a full write operation and is not deactivated after the first time period when a differential voltage is developed on the digit lines. FIG. 7 illustrates another embodiment where delay 212 is reset in response to high or low CAS* signals if a second byte is to be written during the write operation. That is, the first predetermined time is reset when one of the CAS* signals goes low. It will also be appreciated that delays 212 and 214 can be combined into a single delay.

Figure 8:
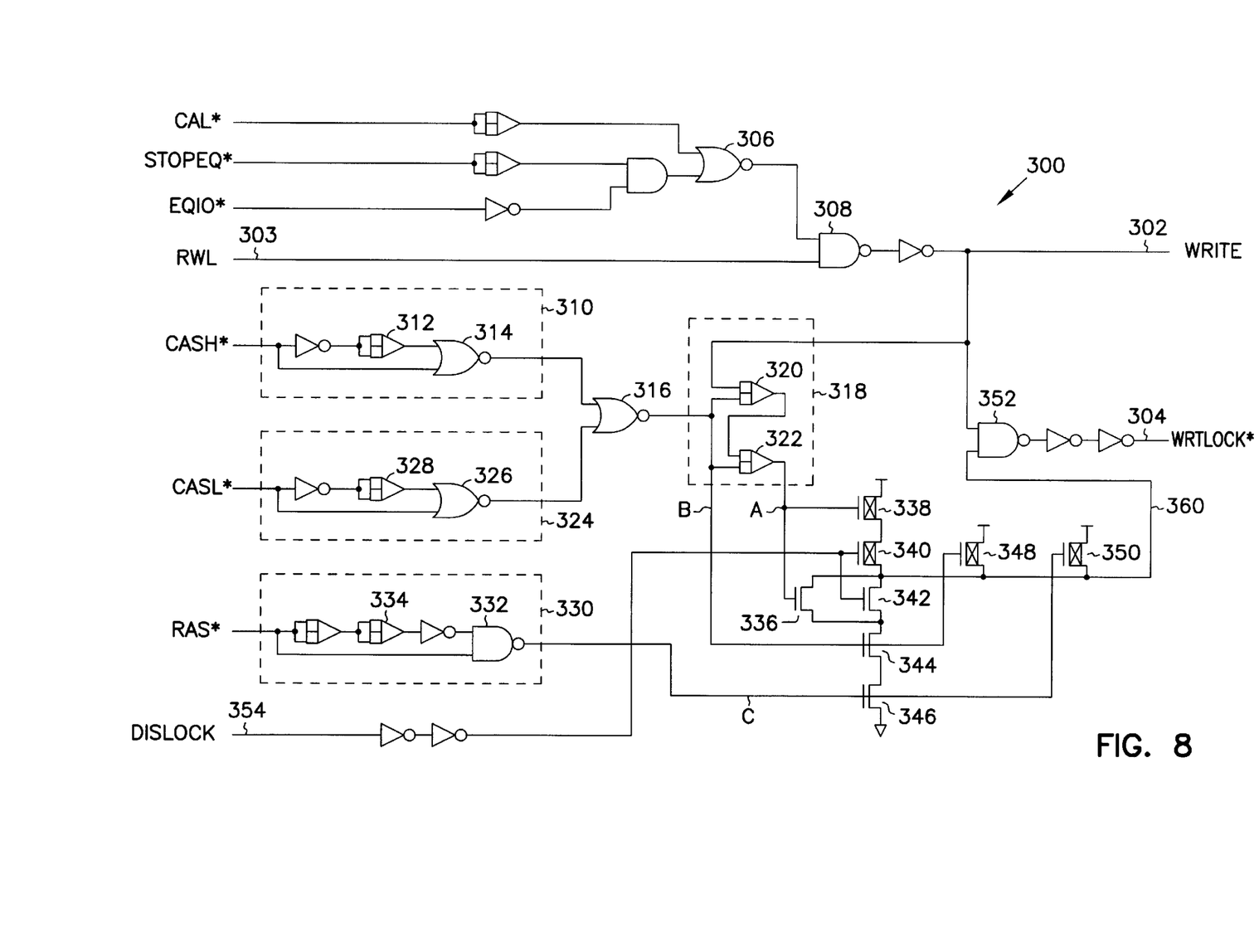
FIG. 8 is a detailed schematic diagram of one embodiment of a write driver control circuit according to one embodiment of the present invention.

FIG. 8 is a schematic diagram of one embodiment of a write driver control circuit 300. The circuit provides a Write signal at node 302 and a Write Lock* signal (WRTLOCK*) at node 304 which is used to latch a RWL signal at node 303. The RWL signal initiates an active Write signal in response to active RAS*, CAS*, and WE* signals, as known to those skilled in the art. To insure that a minimum write cycle driver operation is maintained, the Write Lock* signal latches the RWL signal so that transitions in RAS*, CAS*, and WE* do not prematurely terminate a write operation. The minimum write driver operation time is established to allow the digit lines to transition to different voltage potentials so that sense amplifiers can detect a differential voltage, as explained above.

In addition to the RAS*, CAS*, and WE* signals, a CAL* (Column Address Latch which indicates that a valid column address is present) signal in combination with either a StopEQ* or a EQIO* signal are also used to enable the Write signal. The CAL* signal is input into NOR gate 306. A second input to NOR gate 306 is generated either by an EQIO* signal which indicates an equilibration operation has been completed on input/output line, or by a StopEQ* signal which indicates that the input/output line equilibration operation was terminated to start a write operation. The output of NOR gate 306, therefore, is at a high state during write operations. NAND gate 308 is coupled to NOR gate 306 and the RWL signal. When a write operation is to be performed, the RWL signal transitions to a high state and the output of gate 308 transitions to a low state to provide a high Write signal at node 302.

As stated above, the Write Lock* signal is used to latch the Write signal so that a minimum write time is insured. This is accomplished by holding the Write Lock* signal low until the minimum write time has passed. The circuit of FIG. 8 is best understood by studying its operation in reference to the timing diagram of FIG. 9.

Figure 9:
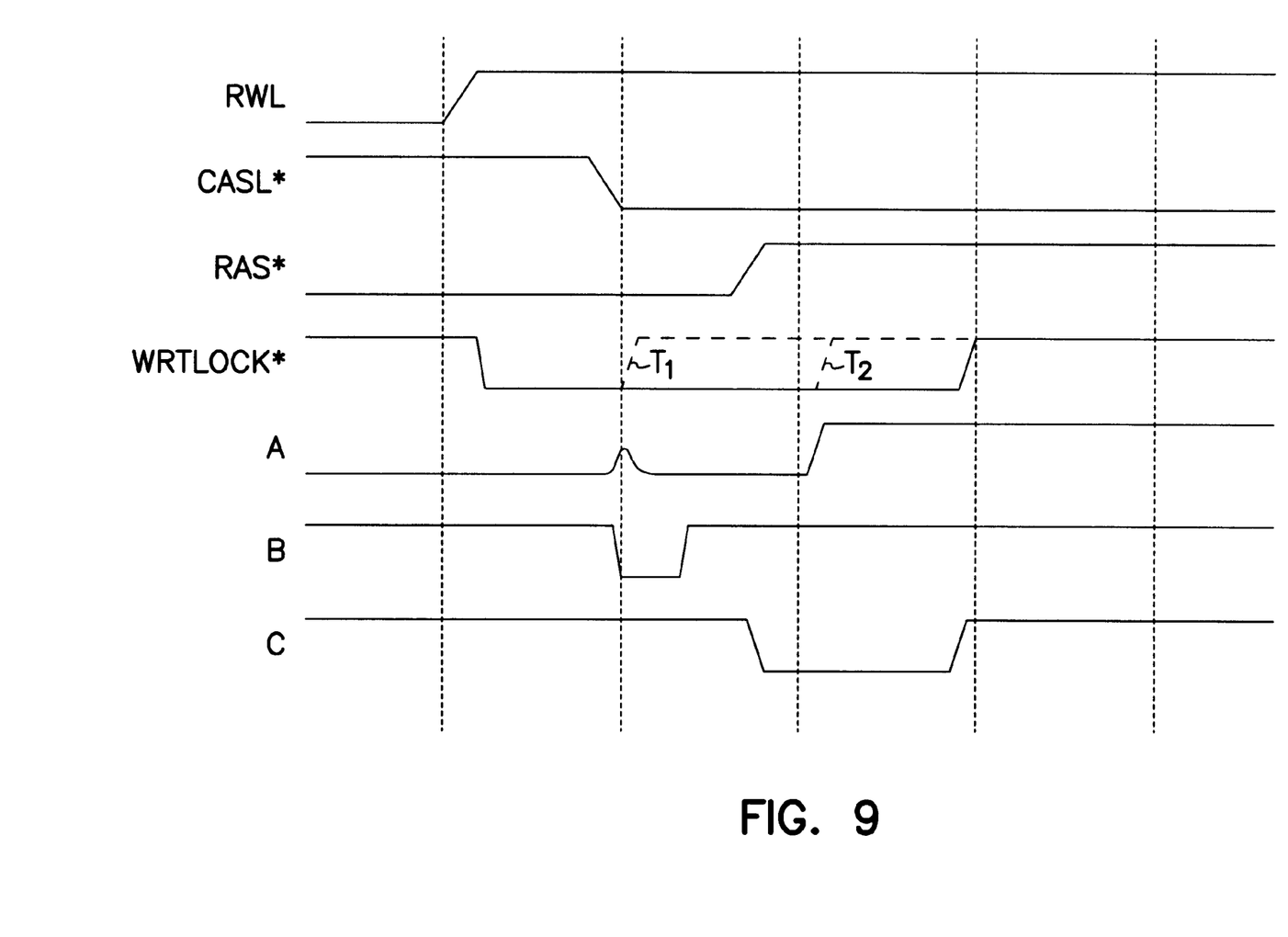
FIG. 9 is a timing diagram of the operation of the circuit of FIG. 8.

The embodiment illustrated is applicable to a memory device with inputoutput data lines which are separated into upper and lower bytes, such as a memory with sixteen DQ lines. Thus, two column address strobe signals (CASL*, CASH*) are used to address upper and lower bytes of data. To begin a write operation, the RWL signal transitions high in response to the required control signals, in this embodiment active RAS*, CAS* and WE* signals are needed. The write operation illustrated in FIG. 9 is initiated as an upper byte write when CASH* transitions low (not shown). CASH* pulse generator circuit 310 provides a high pulse signal from NOR gate 314 when the CASH* signal transitions low. The duration of the pulse signal is dependant upon time delay 312.

Delay circuit 318 is provided to establish the time period in which the Write Lock* signal is active. The delay elements 320 and 322 operate as a two input AND gate, and can be rising-edge-only delays. Thus, the output of delay 322 is low at the start of a write operation, and transistor 338 is active. As a result, input node 360 of NAND gate 352 is pulled high through transistors 338 and 340. It should be noted that transistor 340 is active and transistor 342 is inactive in response to a Dislock signal at node 354. It will be understood that this signal can used to disable the minimum active time period of the write operation by transitioning to an active high state. When NOR gate 314 pulses high, the output of NOR gate 316 pulses low. Pull-up transistor 348, therefore, is activated so that input 360 to NAND gate 352 remains high.

After a time delay established by circuits 320 and 322, the output of delay circuit 318 will transition high in response to the Write signal and the output of NOR gate 316. Transistor 338 is thereby deactivated and transistor 336 is activated. Thus, node 360 will be pulled low when the output of delay circuit 318 transitions high. As such, the Write Lock* signal is in an active low state for the length of the time defined by circuit 318, about 5 ns in this embodiment. The transition in the Write Lock* signal is indicated as a dotted line at $T_1$ to illustrate that the signal can remain low during a subsequent lower byte write operation. As illustrated, during the time period that delay circuit 318 is rippling its high input signals, the CASL* signal transitions to a low state to initiate a lower byte write operation.

Transistor 348 is activated and transistor 344 is deactivated in response to the CASL* signal to maintain node 360 at a high state and the Write Lock* signal low. Further, delay circuit 318 begins to process a new low input signal from NOR 316. Normally, the Write Lock* signal would return to a high state following the CASL* signal transition by a predetermined time period, indicated at $T_2$ as a dotted line in FIG. 9. The Write Lock* signal, however, remains low do to the transition of the RAS* signal. As explained above, it is desirable to close a row of memory as quickly as possible. To speed the closing of a memory row, the write driver remains active by maintaining a low Write Lock* signal. As such, if the RAS* signal transitions to a high state during the write operation, the output of NAND gate 332 will pulse low for a time period determined by delay 334. During this time period, transistor 346 is deactivated and transistor 350 is turned on. As a result, node 360 remains high and the Write Lock* signal stays low to maintain the Write signal so that the write driver is active to speed the closing of a memory row.

Conclusion

A memory has been described above which includes circuitry to modify the operation of a write driver circuit in response to a command to close an accessed memory location. The described memory is but one embodiment and is equally applicable to other memories such as synchronous memories. In such a memory device, the write driver would remain active for an additional clock cycle or portion of a clock cycle if a row is closed subsequent to a write operation.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory device comprising:

an array of memory cells;

a digit line coupled to memory cells of the array;

a sense amplifier coupled to the digit line for sensing a voltage on the digit line;

a write driver circuit for actively driving the digit line during a write operation; and a write driver control circuit for operating the write driver while the sense amplifier is active to complete a write operation prior to closing an accessed row of the array, the write driver control circuit comprises:

a write control circuit for providing a write signal, a latch for latching the write signal, and a latch control circuit coupled to the latch, wherein the latch control circuit comprises a first delay coupled to receive the write signal, and a second delay coupled to receive a row address strobe signal.

2. The memory device of claim 1 wherein the first delay is coupled to receive at least one column address strobe signal.

3. A memory device comprising:

an array of memory cells;

a digit line coupled to memory cells of the array;

a sense amplifier coupled to the digit line for sensing a voltage on the digit line;

a write driver circuit for actively driving the digit line during a write operation; and a write driver control circuit for operating the write driver while the sense amplifier is active to complete a write operation prior to closing an accessed row of the array, wherein the write driver control circuit maintains an active write driver signal if an inactive transition is detected in a row address strobe signal during a write operation when the write driver circuit is active.

4. A memory comprising:

a write driver control circuit for activating a write driver circuit;

a latch coupled to the write driver circuit for latching the write driver in an active state; and a latch control circuit for controlling the latch such that the latch latches the write driver in an active state for a predetermined time period to insure a minimum write time, and the latch continues to latch the write driver in an active state beyond the predetermined time if an accessed row of the memory is commanded to close.

5. The memory of claim 4 wherein the latch control circuit comprises a feedback path for coupling an output of the latch to a delay circuit to generate a lock signal.

6. The memory of claim 4 wherein the latch control circuit comprises a delay circuit for receiving a row address strobe signal and generating a lock signal to latch the write driver in an active state.

7. The memory of claim 4 further comprising:

a column of memory cells; and a sense amplifier circuit coupled to the column of memory cells for driving data during a write operation, the sense amplifier circuit is operable in combination with the write driver when an accessed row of the memory is commanded to close.

8. A dynamic random access memory comprising:

an array of memory cells;

a digit line coupled to memory cell of the array;

a sense amplifier coupled to the digit line for sensing a voltage on the digit line;

a write driver circuit for actively driving the digit line during a write operation; and means for simultaneously activating the sense amplifier and the write driver circuit in response to a command to close an accessed row of the array, such that both the sense amplifier and the write driver circuit drive data on the digit line.

9. The dynamic random access memory of claim 9 further comprising a means for individually activating the sense amplifier and the write driver circuit, such that only one of the sense amplifier or the write driver circuit drive data on the digit line in an absence of a command to close an accessed row of the array.

10. A method of operating a memory device, the method comprising the steps of:

activating a sense amplifier coupled to a digit line;

initiating a memory write operation on an accessed memory row;

activating a write driver circuit to drive a data signal to the digit line;

monitoring control signals provided to the memory device during the memory write operation to determine if the accessed memory row is to be closed; and simultaneously maintaining an active write driver circuit and an active sense amplifier if the accessed memory row is to be closed to increase the execution of the memory write operation.

11. The method of claim 10 wherein the write driver circuit is deactivated prior to completion of a write operation if the accessed memory row is not to be closed.

12. The method of claim 10 wherein the write driver circuit is latched in an active state in response to a transition in a row address strobe signal.

13. The method of claim 10 further comprising the step of generating a write lock signal if it is determined that the accessed memory row is to be closed.

14. A method of writing to a row a memory cells in a memory device, the method comprising the steps of:

receiving an active row address strobe signal (RAS*);

generating a write driver control signal to activate a write driver circuit during a write operation;

activating a latch circuit to latch the write driver control signal for a first predetermined time;

receiving an inactive RAS* signal; and latching the write driver control signal for a second predetermined time beyond the first predetermined time in response to an inactive RAS* signal transition to maintain the write driver circuit in an active state.

15. A processing system comprising:

a memory device comprising:

an array of memory cells;

a digit line coupled to memory cells of the array;

a sense amplifier coupled to the digit line for sensing a voltage on the digit line;

a write driver circuit for actively driving the digit line during a write operation; and a write driver control circuit for operating the write driver while the sense amplifier is active to complete a write operation prior to closing an accessed row of the array; and a processor coupled to the memory for providing control signals to initiate the write operation and closing an accessed row of the array.

16. The processing system of claim 15 wherein the write driver control circuit simultaneously operates the sense amplifier and the write driver in response to an inactive transition in a row address strobe signal provided by the processor.

* * * * *

UNITED STATES PATENT AND TRADEMARK OFFICE
CERTIFICATE OF CORRECTION

PATENT NO. : 5,898,639

DATED : April 27, 1999

INVENTOR(S) : Greg A. Blodgett, Nampa, Id.

It is certified that error appears in the above-identified patent and that said Letters Patent is hereby corrected as shown below:

At Col. 8, line 4, please delete "A method of writing to a row a memory" and insert -- A method of writing to a row of memory --

Column 2, line 21, delete "a" and insert --of--.

Signed and Sealed this

Twenty-second Day of February, 2000

Attest:

Q. TODD DICKINSON

*Attesting Officer*     *Commissioner of Patents and Trademarks*